(12) United States Patent
Hsiao et al.

(10) Patent No.: US 8,061,152 B2
(45) Date of Patent: Nov. 22, 2011

(54) WIND SPEED DETECTING CIRCUIT CAPABLE OF DETECTING THE TIMING FOR REPLACING DUST-PROOF ELEMENT OF ELECTRONIC DEVICE

(75) Inventors: Wu-Hua Hsiao, Taoyuan Hsien (TW); Ren-Chun Chang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 161 days.

(21) Appl. No.: 12/705,420

(22) Filed: Feb. 12, 2010

(65) Prior Publication Data

US 2010/0206065 A1 Aug. 19, 2010

(30) Foreign Application Priority Data

Feb. 19, 2009 (TW) ................................. 98105340 A (51) Int. Cl.
*F25B 49/00* (2006.01)
*G01F 1/00* (2006.01)
(52) U.S. Cl. ............................. 62/129; 374/112; 702/45
(58) Field of Classification Search ........................ None
See application file for complete search history.

(56) References Cited

U.S. PATENT DOCUMENTS

| | | | |
|---|---|---|---|
| 2006/0100796 A1* | 5/2006 | Fraden et al. | 702/45 |
| 2006/0196196 A1* | 9/2006 | Kates | 62/129 |
| 2007/0152552 A1* | 7/2007 | Shih et al. | 313/13 |
| 2008/0016888 A1* | 1/2008 | Kates | 62/127 |

* cited by examiner

*Primary Examiner* — Andre Allen
(74) *Attorney, Agent, or Firm* — Kirton & McConkie; Evan R. Witt (57) ABSTRACT

A wind speed detecting circuit includes a heating unit, a first temperature sensor, a second temperature sensor, a control unit and a driving unit. The first temperature sensor detects a first temperature of an internal portion of an electronic device, thereby generating a first detecting signal. The second temperature sensor detects a second temperature of the heating unit, thereby generating a second detecting signal. The control unit generates a modulation signal according to the first detecting signal and the second detecting signal. In response to the modulation signal, the driving unit generates a driving signal to control operations of the heating unit, so that a temperature difference between the first temperature and the second temperature is maintained constant. A specified relation between the wind speed and the modulation signal facilitates discriminating whether a dust-proof element of the electronic device needs to be replaced.

20 Claims, 7 Drawing Sheets

WIND SPEED DETECTING CIRCUIT CAPABLE OF DETECTING THE TIMING FOR REPLACING DUST-PROOF ELEMENT OF ELECTRONIC DEVICE

FIELD OF THE INVENTION

The present invention relates to a wind speed detecting circuit, and more particularly to a wind speed detecting circuit for discriminating whether a dust-proof element of an electronic device needs to be replaced with a new one.

BACKGROUND OF THE INVENTION

With increasing development of high technology industries, various electronic devices such as power supply apparatuses, air conditioners or projectors become indispensable in our daily lives. During operations of these electronic devices, a great amount of heat is generated. The system stability and the use lives of these electronic devices are dependent on the capability of removing heat.

Take a power supply apparatus for example. The power supply apparatus usually has a fan for quickly removing heat generated during operation of the power supply apparatus. The fan may provide forced airflow for exhausting warm air from the internal portion of the power supply apparatus to the airflow outlet of the power supply apparatus. In addition, a dust-proof element (e.g. an air filter) is usually arranged at the airflow outlet of the electronic device in order to obstruct dust from entering the internal portion of the electronic device and/or exhausting to the environment.

In a case that the dust-proof element has been used for a prolonged period, the degree of dust accumulation becomes more serious and thus the airflow induced by the fan fails to pass through the dust-proof element. Under this circumstance, the heat-removing capability of the power supply apparatus is reduced and the performance of the power supply apparatus is deteriorated. For providing unobstructed airflow, the dust-proof element needs to be periodically cleaned or replaced with a new one.

Conventionally, three mechanisms are used for discriminating whether the dust-proof element needs to be replaced. According to a first mechanism, a notifying signal is generated when the dust-proof element has been used for a certain time period. The first mechanism fails to comply with diverse conditions of using different power supply apparatuses. According to a second mechanism, a notifying signal is generated when the pressure of the airflow passing through the dust-proof element is lower than a threshold value. Since pressure of the airflow is very tiny, it is difficult to accurate measure airflow pressure. In other words, the second mechanism usually erroneously generates the notifying signal. According to a third mechanism, a notifying signal is generated when an intensity of a transmissible light or a reflective light received by an optical receiver is below a threshold value. Since the optical receiver is often contaminated by the dust, the optical receiver will erroneously generate the notifying signal. Under this circumstance, an additional dust cleaner is necessary to clean the optical receiver.

There is a need of providing a wind speed detecting circuit capable of detecting the timing for replacing dust-proof element of electronic device so as to obviate the drawbacks encountered from the prior art.

SUMMARY OF THE INVENTION

It is an object of the present invention to provide a wind speed detecting circuit for accurately discriminating whether a dust-proof element of an electronic device needs to be replaced with a new one.

In accordance with an aspect of the present invention, there is provided a wind speed detecting circuit for detecting a wind speed of an airflow passing through a dust-proof element of an electronic device. The wind speed detecting circuit includes a heating unit, a first temperature sensor, a second temperature sensor, a control unit and a driving unit. The first temperature sensor is used for detecting a first temperature of an internal portion of the electronic device, thereby generating a first detecting signal. The second temperature sensor is connected with the heating unit for detecting a second temperature of the heating unit, thereby generating a second detecting signal. The control unit is connected with the first temperature sensor and the second temperature sensor for generating a modulation signal according to the first detecting signal and the second detecting signal. The driving unit is connected with the heating unit and the control unit for generating a driving signal to control operations of the heating unit in response to the modulation signal, so that a temperature difference between the first temperature and the second temperature is maintained constant. A specified relation between the wind speed and the modulation signal facilitates discriminating whether the dust-proof element needs to be replaced.

In accordance with another aspect of the present invention, there is provided an electronic device. The electronic device includes a fan for inducing airflow, a dust-proof element facing to the fan for obstructing dust contained in the airflow, and an electronic wind speed detecting device having a wind speed detecting circuit for detecting the airflow passing through the dust-proof element at a relatively low wind speed ranged from 0 to 6 m/s and discriminating whether the dust-proof element needs to be replaced.

The above contents of the present invention will become more readily apparent to those ordinarily skilled in the art after reviewing the following detailed description and accompanying drawings, in which:

DETAILED DESCRIPTION OF THE PREFERRED EMBODIMENT

Figure 1:
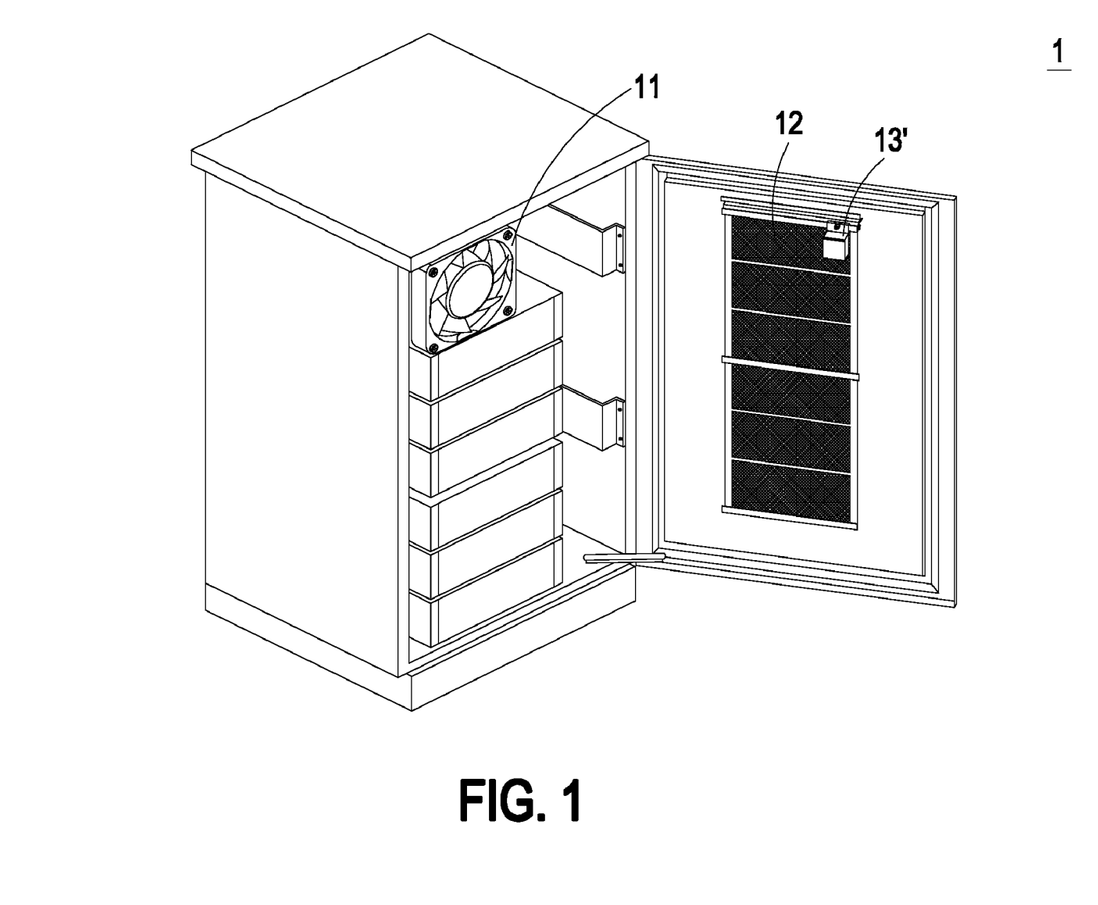
FIG. 1 is a schematic perspective view illustrating an electronic device according to the present invention.
Figure 2:
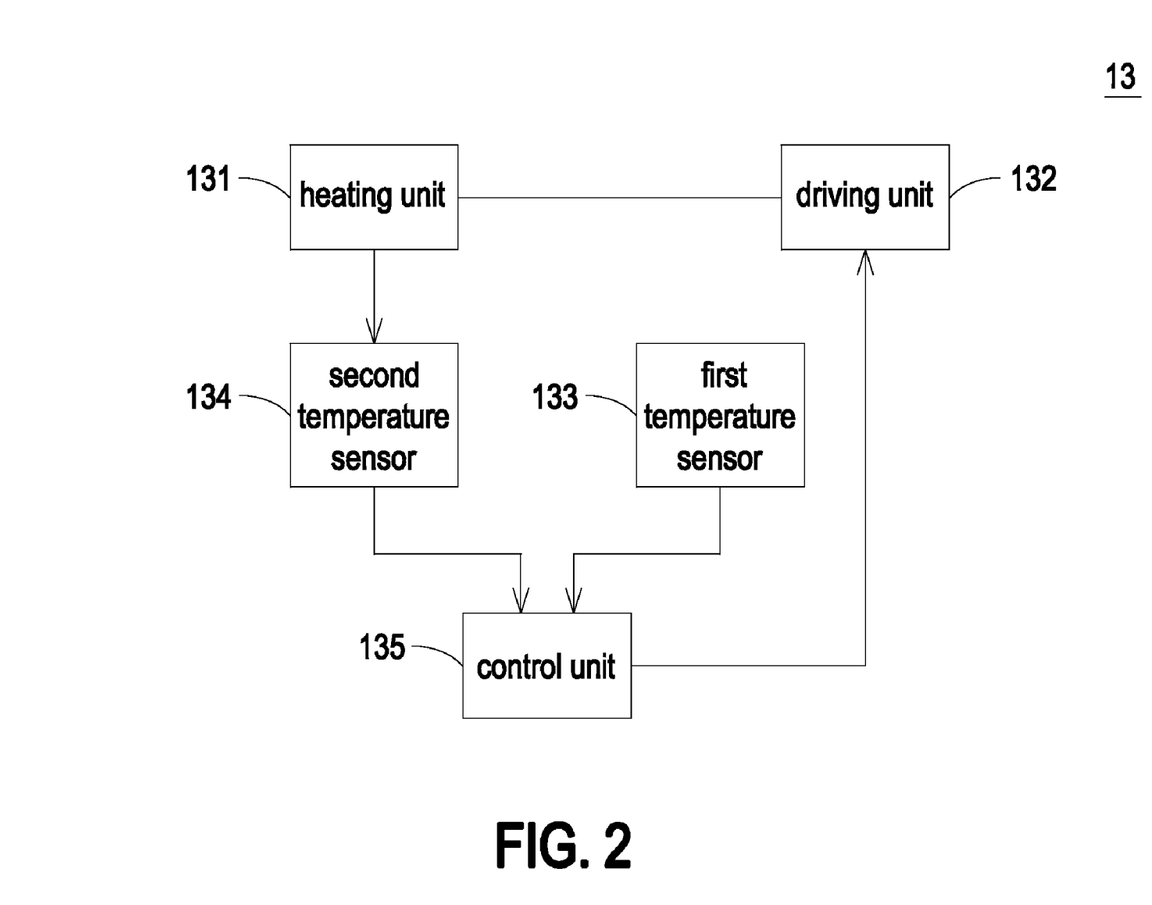
FIG. 2 is a schematic circuit block diagram illustrating a wind speed detecting circuit according to an embodiment of the present invention.

The present invention will now be described more specifically with reference to the following embodiments. It is to be noted that the following descriptions of preferred embodi- FIG. 1 is a schematic perspective view illustrating an electronic device according to the present invention. As shown in FIG. 1, the electronic device 1 principally comprises a fan 11, a dust-proof element 12 and a wind speed detecting device 13'. The fan 11 is used to induce airflow for exhausting warm air from the internal portion of the electronic device 1. It is preferred that the fan 11 is operated at a constant rotating speed. An example of the dust-proof element 12 includes but is not limited to a filter. The dust-proof element 12 is usually arranged at the airflow outlet of the electronic device 1 for sheltering the airflow outlet in order to obstruct dust from entering the internal portion of the electronic device 1. Due to the dust-proof element 12, the electronic device 1 can be operated in a dust-proof environment. The wind speed detecting device 13' is disposed on the dust-proof element 12. The wind speed detecting device 13' has a wind speed detecting circuit 13 (as shown in FIG. 2) for detecting the wind speed of the airflow passing through the dust-proof element 12. According to the wind speed of the airflow passing through the dust-proof element 1, the degree of dust accumulation on the dust-proof element 12 is realized and thus the user can discriminated whether the dust-proof element 12 needs to be replaced with a new one. In this embodiment, the electronic device 1 is a power supply apparatus. The present invention is applied to any electronic device having a fan and a dust-proof element. For example, the electronic device 1 may be an air conditioner, a vacuum cleaner or a projector. The location of the wind speed detecting device 13' is not restricted to the airflow outlet. That is, the wind speed detecting device 13' may be arranged at the location where stable airflow can pass through.

FIG. 2 is a schematic circuit block diagram illustrating a wind speed detecting circuit according to an embodiment of the present invention. As shown in FIG. 2, the wind speed detecting circuit 13 principally comprises a heating unit 131, a driving unit 132, a first temperature sensor 133, a second temperature sensor 134 and a control unit 135. The heating unit 131 is connected with the driving unit 132 and the second temperature sensor 134.

The heating unit 131 is an electric heating element for generating thermal energy. According to a driving signal generated from the driving unit 132, the temperature of the heating unit 131 is adjustable.

The first temperature sensor 133 is connected with the control unit 135 for detecting the temperature of the internal portion of the electronic device 1 or the wind temperature of the wind passing through the dust-proof element 12. That is, the first temperature sensor 133 is used for detecting the temperature of the airflow that is induced by the fan 11 and contacted with the first temperature sensor 133. When the internal temperature of the electronic device 1 or the wind temperature of the wind passing through the dust-proof element 12 is detected by the first temperature sensor 133, the first temperature sensor 133 generates a first detecting signal to the control unit 135. The second temperature sensor 134 is connected with the heating unit 131 and the control unit 135 for detecting the temperature of the heating unit 131, thereby generating a second detecting signal to the control unit 135.

The control unit 135 is connected with the first temperature sensor 133, the second temperature sensor 134 and the driving unit 132. By comparing the first detecting signal with the second detecting signal, the control unit 135 generates a modulation signal to the driving unit 132. An example of the modulation signal includes but is not limited to a pulse width modulation (PWM) signal. In this embodiment, the modulation signal is a pulse width modulation (PWM) signal. The driving unit 132 is connected with the heating unit 131 and the control unit 135. In response to the PWM signal transmitted from the control unit 135, the driving unit 132 generates a driving signal to the heating unit 131 to control operations of the heating unit 131. That is, in response to the driving signal, corresponding electric energy is supplied to the heating unit 131 and thus the heating unit 131 generates thermal energy.

In this embodiment, under control of the control unit 135, the duty cycle of the PWM signal is changed according to the first detecting signal and the second detecting signal. As the duty cycle of the PWM signal is changed, the magnitude of the electric energy supplied form the driving unit 132 to the heating unit 131 is adjusted. Consequently, there is a constant temperature difference between the temperature of the heating unit 131 and the temperature of the internal portion of the electronic device 1.

As the wind speed of the airflow passing through the dust-proof element 12 is increased, more thermal energy generated from the heating unit 131 is removed away. In this case, the duty cycle of the PWM signal is increased under control of the control unit 135, and thus more electric energy is supplied from the driving unit 132 to the heating unit 131. As such, the temperature difference between the temperature of the heating unit 131 and the temperature of the internal portion of the electronic device 1 will be kept constant. On the other hand, as the wind speed of the airflow passing through the dust-proof element 12 is decreased, less thermal energy generated from the heating unit 131 is removed away. In this case, the duty cycle of the PWM signal is decreased under control of the control unit 135, and thus less electric energy is supplied from the driving unit 132 to the heating unit 131. As such, the temperature difference between the temperature of the heating unit 131 and the temperature of the internal portion of the electronic device 1 will be also kept constant. In other words, as the wind speed of the airflow passing through the dust-proof element 12 is increased or decreased, the duty cycle of the PWM signal is correspondingly increased or decreased.

In an embodiment, the wind speed of the airflow passing through the dust-proof element 12 and the duty cycle of the PWM signal generated from the control unit 135 comply with a linear relation. The linear relation can reduce the circuitry complexity of the wind speed detecting circuit 13. In some embodiments, the wind speed of the airflow passing through the dust-proof element 12 and the duty cycle of the PWM signal generated from the control unit 135 comply with a nonlinear relation. Under this circumstance, a look-up table correlating the wind speed of the airflow passing through the dust-proof element 12 to the duty cycle of the PWM signal generated from the control unit 135 needs to be previously established. According to the look-up table, the duty cycle of the PWM signal is adjusted as the wind speed of the airflow is changed.

Figure 3:
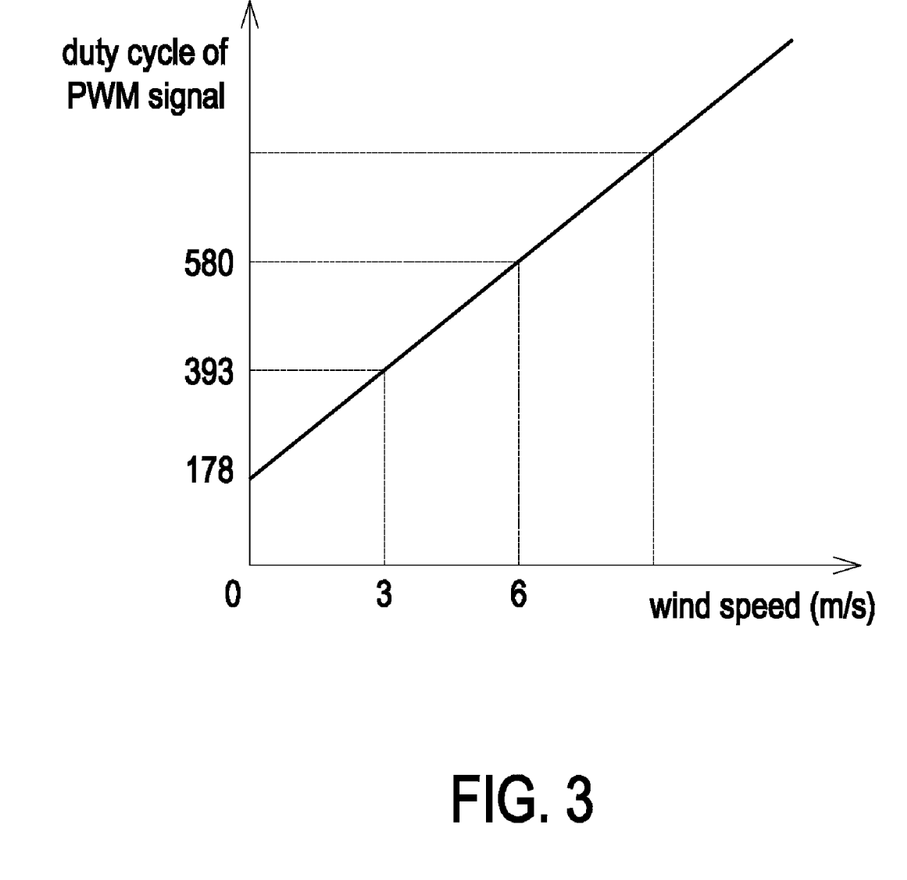
FIG. 3 is a schematic plot showing a relation between the wind speed of the airflow passing through the dust-proof element and duty cycle of the PWM signal generated from the control unit.

Hereinafter, the uses of the wind speed of the airflow passing through the dust-proof element to discriminate whether the dust-proof element will be illustrated in more details with reference to FIG. 3. FIG. 3 is a schematic plot showing a relation between the wind speed of the airflow passing through the dust-proof element and duty cycle of the PWM signal generated from the control unit. In this embodiment, the wind speed of the airflow passing through the dust-proof element 12 and the duty cycle of the PWM signal generated from the control unit 135 comply with a linear relation.

If the electronic device 1 is initiated and the fan 11 is in an off status, the wind speed is zero. In this case, the duty cycle of the PWM signal generated from the control unit 135 is very low (e.g. 178). According to the duty cycle of the PWM signal, little less electric energy is supplied from the driving unit 132 to the heating unit 131. As such, the temperature difference between the temperature of the heating unit 131 and the temperature of the internal portion of the electronic device 1 is maintained at a constant value.

If the fan 11 is operated at a specified rotating speed and only little dust is accumulated on the dust-proof element 12, the airflow induced by the fan 11 can smoothly pass through the dust-proof element 12. In this case, the wind speed of the airflow passing through the dust-proof element 12 is increased (e.g. 6 m/s) and more heat generated from the heating unit 131 is removed. As such, the temperature of the heating unit 131 is decreased. For maintaining the temperature difference between the temperature of the heating unit 131 and the temperature of the internal portion of the electronic device 1 at the constant value, the duty cycle of the PWM signal generated from the control unit 135 is increased (e.g. 580). Since the duty cycle of the PWM signal is increased, more electric energy is supplied from the driving unit 132 to the heating unit 131. As such, the temperature difference between the temperature of the heating unit 131 and the temperature of the internal portion of the electronic device 1 is maintained at the constant value.

If the fan 11 is operated at a specified rotating speed but much dust is accumulated on the dust-proof element 12, the airflow induced by the fan 11 fails to smoothly pass through the dust-proof element 12. In this case, the wind speed of the airflow passing through the dust-proof element 12 is decreased (e.g. 3 m/s) and only little heat generated from the heating unit 131 is removed. Due to the poor heat-removing capability, the temperature of the heating unit 131 is increased. For maintaining the temperature difference between the temperature of the heating unit 131 and the temperature of the internal portion of the electronic device 1 at the constant value, the duty cycle of the PWM signal generated from the control unit 135 is decreased (e.g. 393). Since the duty cycle of the PWM signal is decreased, less electric energy is supplied from the driving unit 132 to the heating unit 131. As such, the temperature difference between the temperature of the heating unit 131 and the temperature of the internal portion of the electronic device 1 is also maintained at the constant value.

From the above discussion, a smaller duty cycle of the PWM signal generated from the control unit 135 indicates a lower wind speed of the airflow passing through the dust-proof element 12 but a larger degree of dust accumulation on the dust-proof element 12. Otherwise, a larger duty cycle of the PWM signal generated from the control unit 135 indicates a higher wind speed of the airflow passing through the dust-proof element 12 but a smaller degree of dust accumulation on the dust-proof element 12. In accordance with a key feature of the present invention, the wind speed of the airflow passing through the dust-proof element 12 is realized by indirectly detecting the duty cycle of the PWM signal generated from the control unit 135. Since the wind speed of the airflow passing through the dust-proof element 12 is inversely related to the degree of dust accumulation on the dust-proof element 12, the user can discriminate whether the dust-proof element 12 needs to be replaced with a new one according to the duty cycle of the PWM signal.

In an embodiment, the heating unit 131 includes a resistor that is known in the art. It is preferred that the resistor is a low temperature coefficient resistor. An example of the low temperature coefficient resistor includes but is not limited to a metal oxide film resistor. In an embodiment, the heating unit 131 includes a tungsten wire or an alloy, which is more thermal-resistant and costly than the resistor. Moreover, the first temperature sensor 133 and the second temperature sensor 134 are temperature-sensing integrated circuits.

In an embodiment, the constant temperature difference between the temperature of the heating unit 131 and the temperature of the internal portion of the electronic device 1 is 40° C. The constant temperature difference is varied according to the practical requirements.

Figure 4:
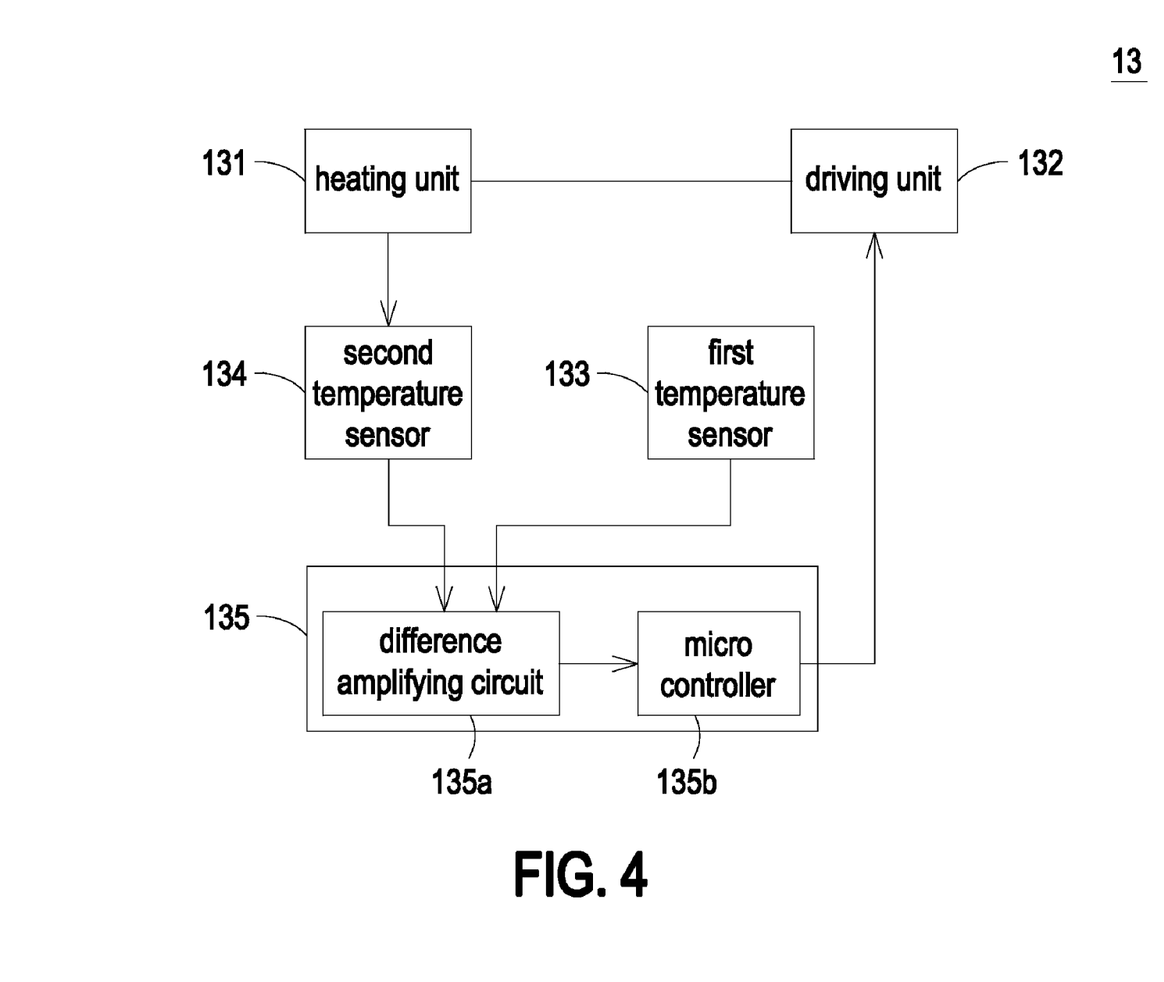
FIG. 4 is a schematic circuit block diagram illustrating a first variant example of the wind speed detecting circuit shown in FIG. 2.

FIG. 4 is a schematic circuit block diagram illustrating a first variant example of the wind speed detecting circuit shown in FIG. 2. As shown in FIG. 4, the control unit 135 includes a difference amplifying circuit 135a and a micro controller 135b. The input terminals of the difference amplifying circuit 135a are respectively connected to the first temperature sensor 133 and the second temperature sensor 134. The output terminal of the difference amplifying circuit 135a is connected to the input terminal of the micro controller 135b. By comparing the first detecting signal with the second detecting signal, the difference amplifying circuit 135a generates a difference amplifying signal to the micro controller 135b according to the comparing result. The input terminal of the micro controller 135b is connected to the output terminal of the difference amplifying circuit 135a. The output terminal of the micro controller 135b is connected to the driving unit 132. According to the difference amplifying signal transmitted from the difference amplifying circuit 135a, the micro controller 135b generates a pulse width modulation with an adjustable duty cycle.

Figure 5:
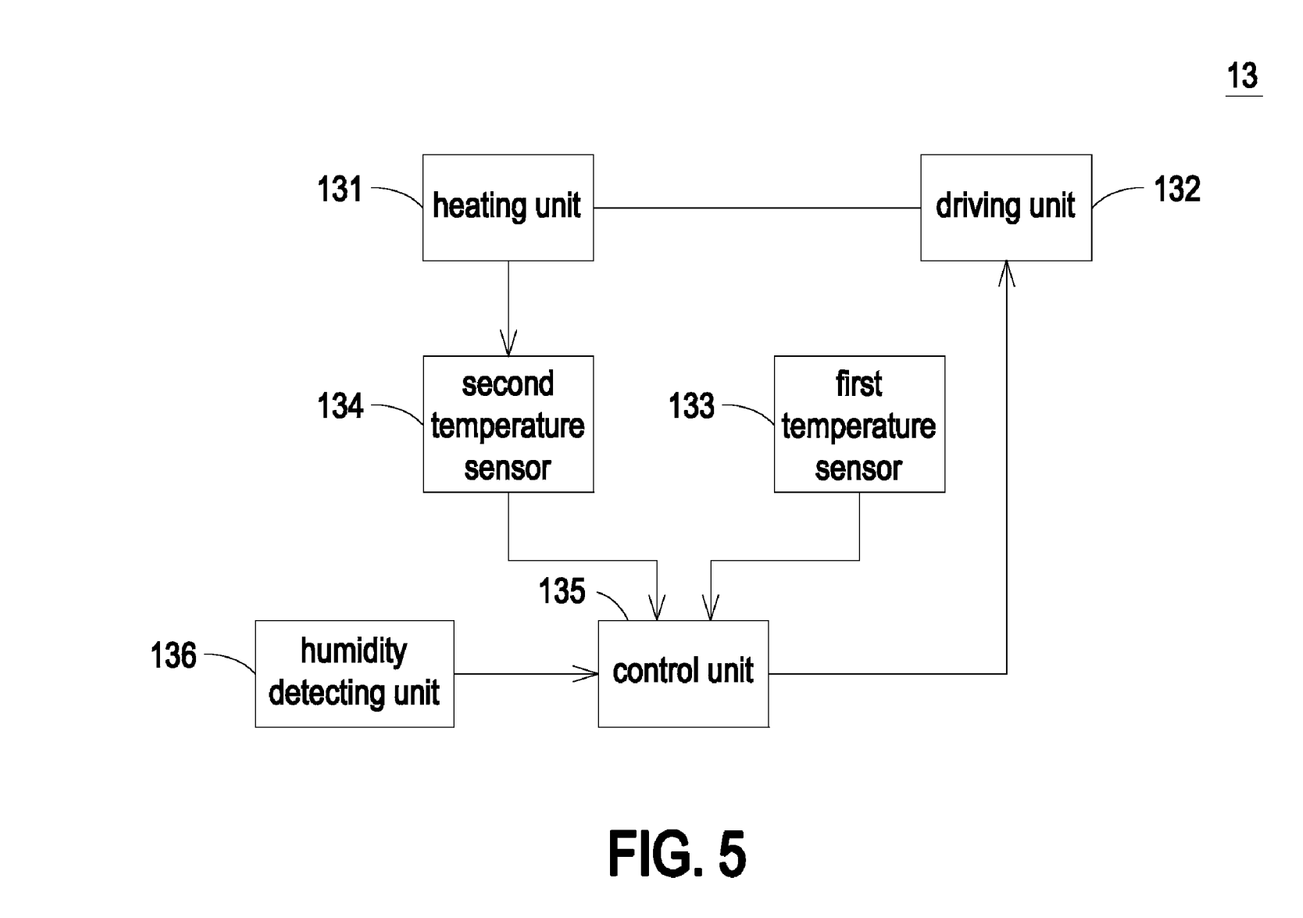
FIG. 5 is a schematic circuit block diagram illustrating a second variant example of the wind speed detecting circuit shown in FIG. 2.

FIG. 5 is a schematic circuit block diagram illustrating a second variant example of the wind speed detecting circuit shown in FIG. 2. In this embodiment, the wind speed detecting circuit 13 further includes a humidity detecting unit 136. The humidity detecting unit 136 is connected with the control unit 135 for detecting the humidity in the internal portion of the electronic device 1, thereby generating a first compensating signal to the control unit 135. Under control of the control unit 135, the duty cycle of the PWM signal is changed according to the first compensating signal.

Figure 6:
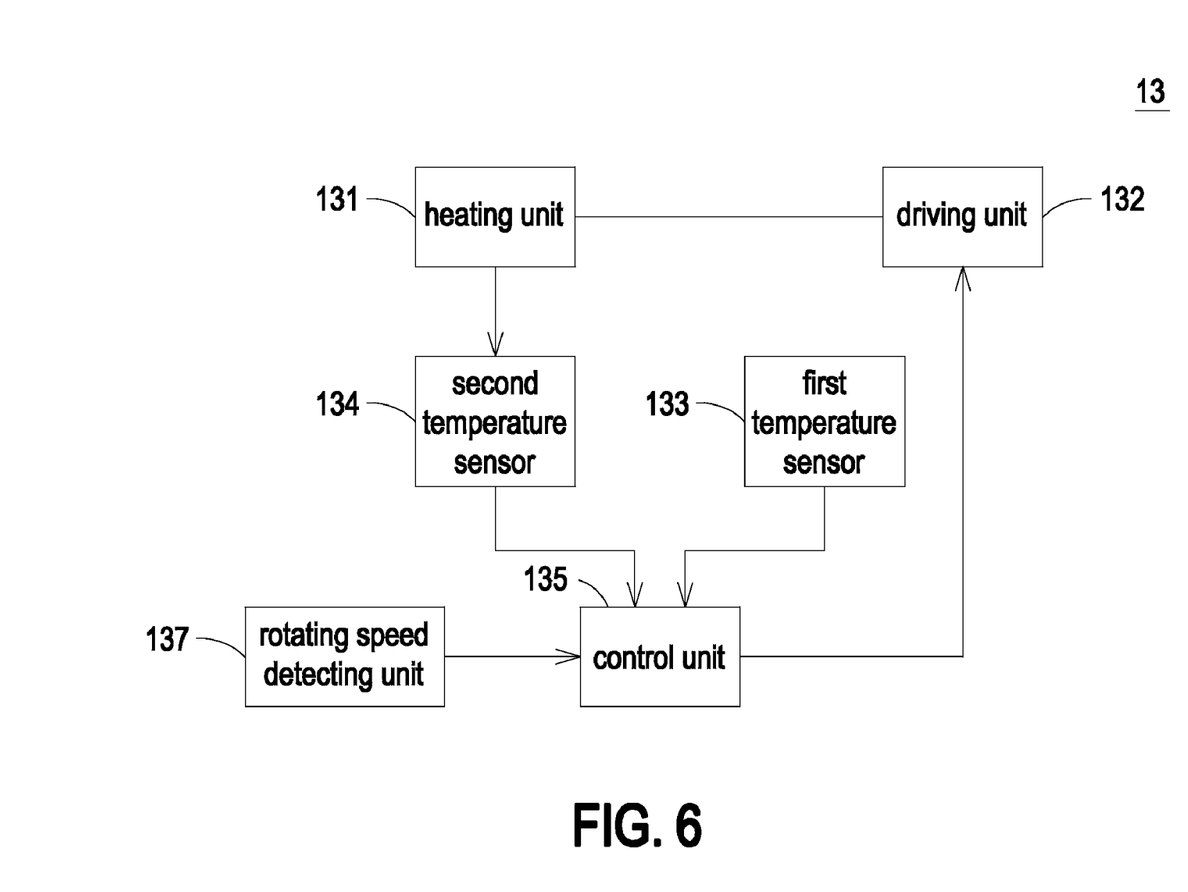
FIG. 6 is a schematic circuit block diagram illustrating a third variant example of the wind speed detecting circuit shown in FIG. 2.

FIG. 6 is a schematic circuit block diagram illustrating a third variant example of the wind speed detecting circuit shown in FIG. 2. In this embodiment, the wind speed detecting circuit 13 further includes a rotating speed detecting unit 137. The rotating speed detecting unit 137 is connected with the control unit 135 for detecting the rotating speed of the fan 11 according to a current, a voltage or a cycle control signal generated when the fan 11 is rotated, thereby generating a second compensating signal to the control unit 135. Under control of the control unit 135, the duty cycle of the PWM signal is changed according to the second compensating signal.

Figure 7:
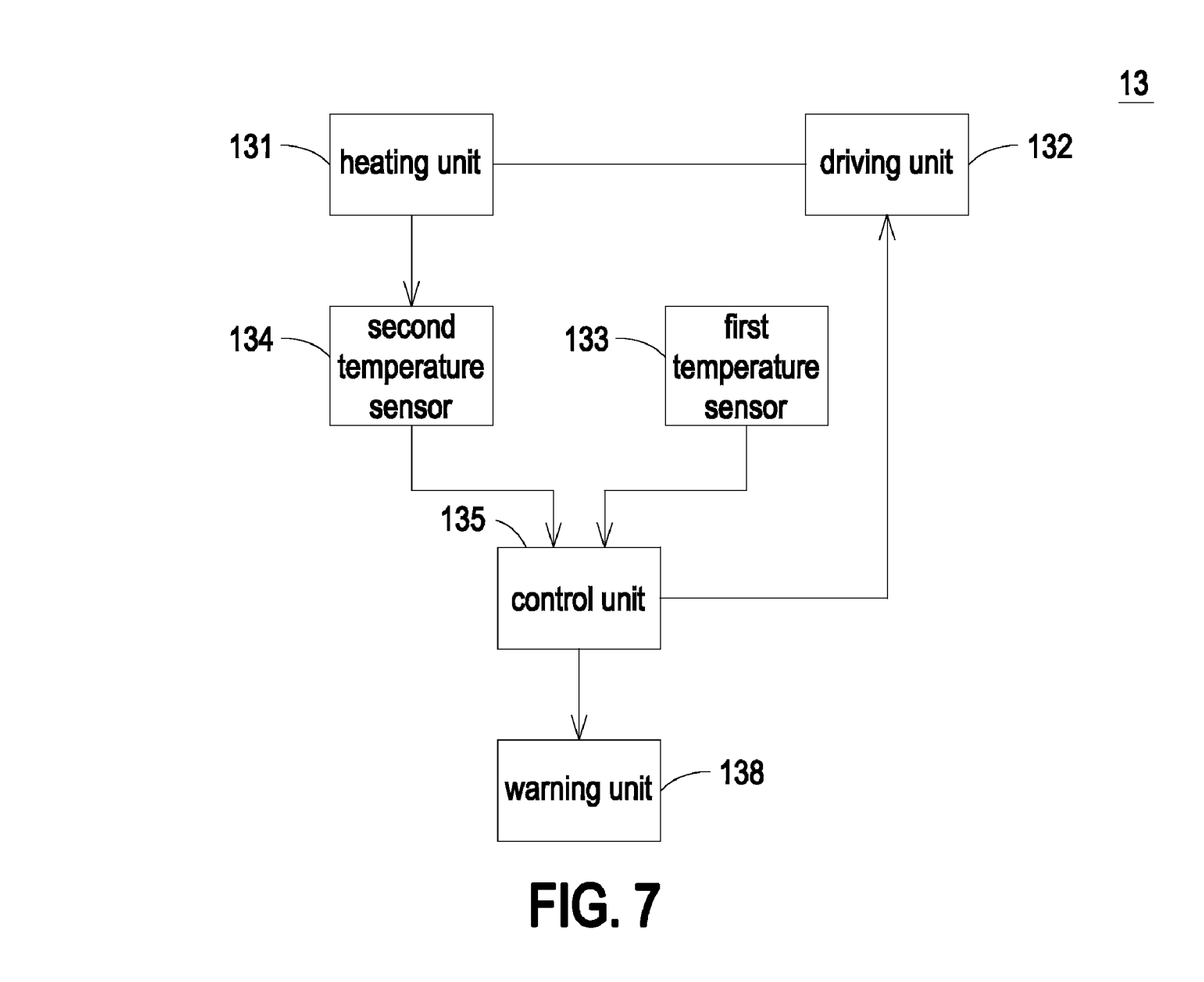
FIG. 7 is a schematic circuit block diagram illustrating a fourth variant example of the wind speed detecting circuit shown in FIG. 2.

FIG. 7 is a schematic circuit block diagram illustrating a fourth variant example of the wind speed detecting circuit shown in FIG. 2. In this embodiment, the wind speed detecting circuit 13 further includes a warning unit 138. The warning unit 138 is connected with the control unit 135. If the duty cycle of the PWM signal generated from the control unit 135 is below a first threshold value, the warning unit 138 will issue a warning signal to notify the user that the dust-proof element 12 needs to be replaced with a new one.

As known, the wind speed of the airflow passing through the dust-proof element is usually unstable due to a drift of the airflow. The unstable wind speed of the airflow causes unsteady PWM signal and thus the warning signal is erroneously generated from the warning unit 138. For preventing from erroneously generating the warning signal, if the duty cycle of the PWM signal generated from the control unit 135 is below the first threshold value, the warning unit 138 will not instantly issue the warning signal. On the other hand, after the duty cycle of the PWM signal is below the first threshold value and the duty cycle of the PWM signal has been continuously below a second threshold value for a certain time interval, the warning unit 138 will issue a warning signal to notify the user that the dust-proof element 12 needs to be replaced with a new one. Even if the wind speed of the airflow passing through the dust-proof element suddenly drops because the airflow outlet is temporarily obstructed by an foreign article for example, the warning unit 138 will not instantly issue the warning signal. As a consequence, the possibility of erroneously generating the warning signal is reduced.

From the above description, the electronic wind speed detecting device is used for detecting the airflow passing through a dust-proof element of an electronic device at a relatively low wind speed ranged from 0 to 6 m/s, which can't be detected by a mechanical wind speed detecting device. The wind speed of the airflow passing through the dust-proof element is realized by indirectly detecting the duty cycle of the PWM signal generated from the control unit. Since the wind speed of the airflow passing through the dust-proof element is inversely related to the degree of dust accumulation on the dust-proof element, the user can discriminate whether the dust-proof element needs to be replaced with a new one according to the duty cycle of the PWM signal. In comparison with the prior art, the wind speed detecting device can determine the timing of replacing the dust-proof element in a more accurate and cost-effective manner.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A wind speed detecting circuit for detecting a wind speed of an airflow passing through a dust-proof element of an electronic device, said wind speed detecting circuit comprising:
   a heating unit;
   a first temperature sensor for detecting a first temperature of an internal portion of said electronic device, thereby generating a first detecting signal;
   a second temperature sensor connected with said heating unit for detecting a second temperature of said heating unit, thereby generating a second detecting signal;
   a control unit connected with said first temperature sensor and said second temperature sensor for generating a modulation signal according to said first detecting signal and said second detecting signal; and
   a driving unit connected with said heating unit and said control unit for generating a driving signal to control operations of said heating unit in response to said modulation signal, so that a temperature difference between said first temperature and said second temperature is maintained constant,
   wherein a specified relation between said wind speed and said modulation signal facilitates discriminating whether said dust-proof element needs to be replaced.

2. The wind speed detecting circuit according to claim 1 wherein said wind speed and a duty cycle of said modulation signal comply with a linear relation.

3. The wind speed detecting circuit according to claim 1 wherein said wind speed and a duty cycle of said modulation signal comply with a nonlinear relation, which is realized according to a look-up table.

4. The wind speed detecting circuit according to claim 1 wherein said heating unit includes at least a resistor.

5. The wind speed detecting circuit according to claim 4 wherein said resistor is a metal oxide film resistor.

6. The wind speed detecting circuit according to claim 1 wherein said first temperature sensor and said second temperature sensor are temperature-sensing integrated circuits.

7. The wind speed detecting circuit according to claim 1 wherein said control unit includes a difference amplifying circuit connected with said first temperature sensor and said second temperature sensor, wherein said difference amplifying circuit generates a difference amplifying signal according to a comparing result by comparing said first detecting signal with said second detecting signal.

8. The wind speed detecting circuit according to claim 7 wherein said control unit further includes a micro controller connected with said difference amplifying circuit and said driving circuit for adjusting a duty cycle of said modulation signal according to said difference amplifying signal.

9. The wind speed detecting circuit according to claim 1 further comprising a humidity detecting unit connected with said control unit for detecting a humidity in said internal portion of said electronic device, wherein said humidity detecting unit generates a first compensating signal indicative of said humidity to said control unit, and said control unit adjusts a duty cycle of said modulation signal according to said first compensating signal.

10. The wind speed detecting circuit according to claim 1 further comprising a rotating speed detecting unit connected with said control unit for detecting a rotating speed of said fan according to a current or a voltage generated during rotation of said fan, wherein said rotating speed detecting unit generates a second compensating signal indicative of said rotating speed to said control unit, and said control unit adjusts a duty cycle of said modulation signal according to said second compensating signal.

11. The wind speed detecting circuit according to claim 1 further comprising a warning unit connected with said control unit for issuing a warning signal.

12. The wind speed detecting circuit according to claim 11 wherein when a duty cycle of said modulation signal is below a first threshold value, said warning unit issues said warning signal.

13. The wind speed detecting circuit according to claim 12 wherein when said duty cycle of said modulation signal is below said first threshold value and said duty cycle of said modulation signal has been continuously below a second threshold value for a certain time interval, said warning unit issues said warning signal.

14. The wind speed detecting circuit according to claim 1 wherein said modulation signal is a pulse width modulation signal.

15. An electronic device comprising:
   a fan for inducing an airflow;
   a dust-proof element facing to said fan for obstructing dust contained in said airflow; and
   an electronic wind speed detecting device having a wind speed detecting circuit for detecting said airflow passing through said dust-proof element at a lower wind speed ranged from 0 to 6 m/s and discriminating whether said dust-proof element needs to be replaced.

16. The electronic device according to claim 15 wherein said dust-proof element is a filter.

17. The electronic device according to claim 15 wherein said wind speed detecting circuit comprises:
- a heating unit;
- a first temperature sensor for detecting a first temperature of an internal portion of said electronic device, thereby generating a first detecting signal;
- a second temperature sensor connected with said heating unit for detecting a second temperature of said heating unit, thereby generating a second detecting signal;
- a control unit connected with said first temperature sensor and said second temperature sensor for generating a modulation signal according to said first detecting signal and said second detecting signal; and
- a driving unit connected with said heating unit and said control unit for generating a driving signal to control operations of said heating unit in response to said modulation signal, so that a temperature difference between said first temperature and said second temperature is maintained constant,
- wherein a specified relation between said wind speed and said modulation signal facilitates discriminating whether said dust-proof element needs to be replaced.

18. The electronic device according to claim 17 wherein said control unit includes a difference amplifying circuit connected with said first temperature sensor and said second temperature sensor, wherein said difference amplifying circuit generates a difference amplifying signal according to a comparing result by comparing said first detecting signal with said second detecting signal.

19. The electronic device according to claim 18 wherein said control unit further includes a micro controller connected with said difference amplifying circuit and said driving circuit for adjusting a duty cycle of said modulation signal according to said difference amplifying signal.

20. The electronic device according to claim 17 wherein said wind speed and a duty cycle of said modulation signal comply with a linear relation or a nonlinear relation, which is realized according to a look-up table.

* * * * *